United States Patent
Tsai et al.

(10) Patent No.: US 11,876,048 B2
(45) Date of Patent: Jan. 16, 2024

(54) MEMORY DEVICE AND METHOD OF MANUFACTURING THE SAME

(71) Applicant: Winbond Electronics Corp., Taichung (TW)

(72) Inventors: Wen-Chieh Tsai, Taichung (TW); Cheng-Ta Yang, Taichung (TW); Tsung-Wei Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 255 days.

(21) Appl. No.: 17/504,546

(22) Filed: Oct. 19, 2021

(65) Prior Publication Data

US 2023/0118367 A1   Apr. 20, 2023

(51) Int. Cl.
*H01L 21/00* (2006.01)
*H01L 23/528* (2006.01)
*H01L 21/768* (2006.01)

(52) U.S. Cl.
CPC ...... *H01L 23/528* (2013.01); *H01L 21/76816* (2013.01)

(58) Field of Classification Search
CPC . H01L 21/00; H01L 23/528; H01L 21/76816; H10B 41/35
See application file for complete search history.

(56) References Cited

U.S. PATENT DOCUMENTS

| | | | | |
|---|---|---|---|---|
| 9,698,151 B2 * | 7/2017 | Lee | | H10B 43/50 |
| RE48,482 E * | 3/2021 | Lee | | H01L 21/76816 |
| 11,631,685 B2 * | 4/2023 | Wang | | H01L 29/40114 |
| | | | | 257/321 |
| 11,682,557 B2 * | 6/2023 | Chiang | | H01L 23/585 |
| | | | | 257/797 |
| 2017/0040061 A1 * | 2/2017 | Yeh | | G11C 16/0483 |
| 2017/0103993 A1 * | 4/2017 | Lee | | H10B 43/35 |
| 2021/0391167 A1 * | 12/2021 | Chiang | | H01L 21/0274 |
| 2022/0320126 A1 * | 10/2022 | Wang | | H01L 29/42328 |
| 2023/0118367 A1 * | 4/2023 | Tsai | | H10B 41/50 |
| | | | | 257/773 |
| 2023/0209823 A1 * | 6/2023 | Wang | | H10B 41/35 |
| | | | | 257/321 |

FOREIGN PATENT DOCUMENTS

| | | | |
|---|---|---|---|
| CN | 115206979 A | * | 10/2022 |
| CN | 115915766 A | * | 4/2023 |
| TW | 202011579 | | 3/2020 |

OTHER PUBLICATIONS

"Office Action of Taiwan Counterpart Application", dated Oct. 24, 2022, p. 1-p. 4.

* cited by examiner

Primary Examiner — Laura M Menz
(74) Attorney, Agent, or Firm — JCIPRNET (57) ABSTRACT

Provided is a memory device, including: a substrate; a plurality of word lines, extending in a first direction, arranged in a second direction, disposed on the substrate; a dummy structure, adjacent to ends of the word lines, disposed on the substrate, wherein the dummy structure includes a main part that extends in the second direction; and a plurality of extension parts, extending in the first direction, connected to the main part, and interposed between the main part and the word lines.

9 Claims, 10 Drawing Sheets

MEMORY DEVICE AND METHOD OF MANUFACTURING THE SAME

BACKGROUND

Technical Field

The present disclosure relates to a semiconductor device and a method of manufacturing the same, particularly relates to a memory device and a method of manufacturing the same.

Description of Related Art

With the advancement of technology, electronic products are developed to be even lighter, thinner, slimmer, and smaller. The critical dimension of memory devices is also gradually shrinking, posing more difficulties for the lithography process. Methods for reducing critical dimensions in the conventional lithography process include using optical elements with larger numerical apertures (NA), adopting shorter exposure wavelengths (such as EUV), or using interface media other than air (such as water immersion). As the resolution of the conventional lithography process approaches the theoretical limit, manufacturers have begun to turn to the double patterning (DP) to overcome the optical limit and further increase the integration of memory devices.

However, in the current patterning method, the etching process may exhibit a loading effect due to the difference between the pattern density of the center and that of the end of the array region, which in turn makes the contour of the memory cells at the center and that of the end of the array region inconsistent, bringing problems in electrical properties.

SUMMARY

The present disclosure provides a memory device, including: a substrate; a plurality of word lines extending in a first direction, arranged in a second direction, and disposed on the substrate; a dummy structure, adjacent to ends of the word lines, disposed on the substrate, wherein the dummy structure includes: a main part extending in the second direction; and a plurality of extension parts extending in the first direction, connected to the main part, and interposed between the main part and the word lines.

The present disclosure provides a method of manufacturing a memory device, including: providing a substrate; forming a target layer and a hard mask layer on the substrate; patterning the hard mask layer to form a patterned hard mask layer, the patterned hard mask layer includes: a plurality of first patterns, a second pattern, and a plurality of third patterns, wherein the first patterns extend in a first direction and are arranged in a second direction, the second pattern is comb-shaped and disposed between the first patterns and the third patterns, and the third patterns extend in the second direction and are arranged in the first direction; and with the patterned hard mask layer, the first patterns, the second patterns, and transferring the first patterns, the second pattern, and the third patterns to the target layer by using the patterned hard mask layer, so as to form a plurality of word lines, a comb-shaped dummy structure, and a plurality of landing pads.

Based on the above, in the embodiment of the present disclosure, adding dummy patterns in the array region and the winding region reduces the loading effect between the end and the center of the array region during the etching process.

DESCRIPTION OF THE EMBODIMENTS

Figure 1A:
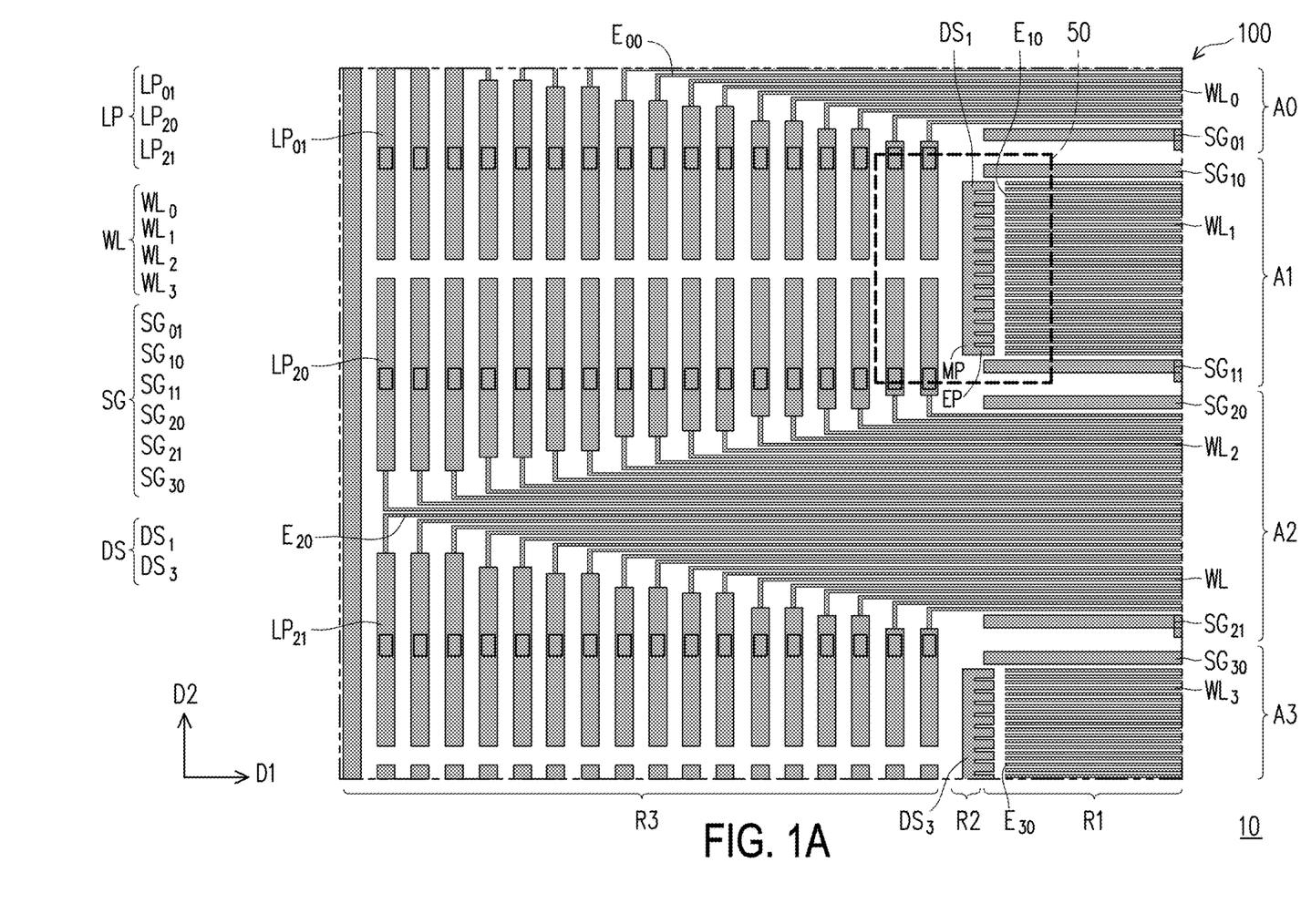
FIG. 1A is a top view of a memory device according to an embodiment of the disclosure.
Figure 1B:
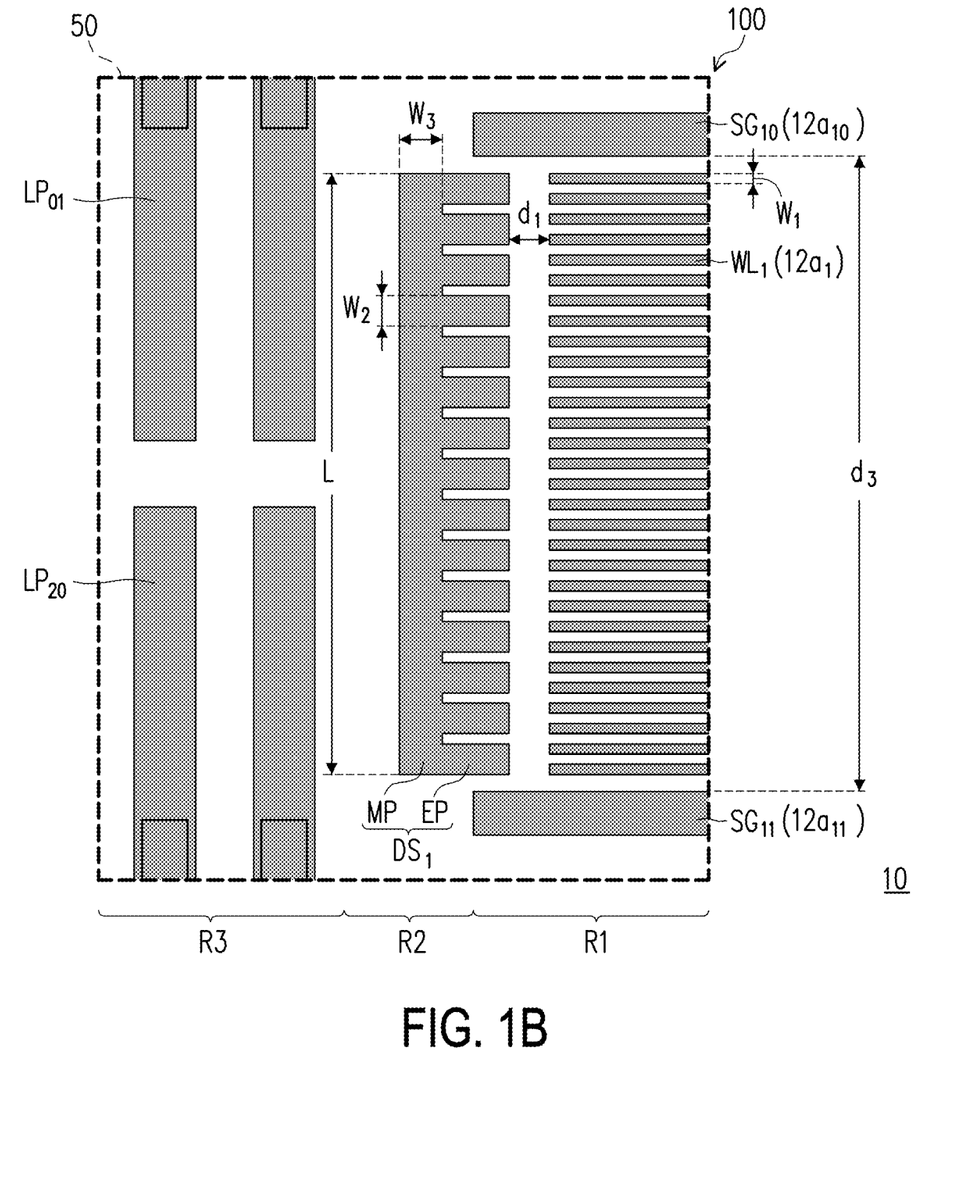
FIG. 1B is a partial enlarged view of the area 50 of FIG. 1A.

In FIG. 1A and FIG. 1B, a memory device 100 is formed on a substrate 10. In the direction D2, the substrate 10 is divided into a plurality of areas A0, A1, A2, A3, and so on. Each area, area A1 for example, may include an array region R1, a transition region R2, and a winding region R3. The transition region R2 is disposed between the array region R1 and the winding region R3.

The memory device 100 includes a plurality of word lines WL and a plurality of selection gates SG. An end of each word line WL is disposed in the array region, and the other end extends to the winding area. In some embodiments, one ends of the word lines WL are aligned with each other and are arranged in an "I" shape; the other ends of the word lines WL are not aligned but are arranged in a horizontal "V" shape.

For example, the word lines WL include a plurality of word lines $WL_0$, $WL_1$, and $WL_2$. The word line $WL_0/WL_2$ is arranged in the array region R1 of the area A0/A2, and their ends $E_{00}/E_{20}$ also extend to the winding region R3 and are respectively arranged in a horizontal "V" shape. The other ends (not shown) of the word lines $WL_0/WL_2$ are disposed in the array region R1 but do not extend to another winding region (not shown), and they are respectively aligned and arranged into an "I" shape. A plurality of word lines $WL_1/WL_3$ are arranged in the array region R1 of the area A1/A3 and their ends $E_{10}/E_{30}$ do not extend to the winding region R3, and are respectively aligned and arranged in an "I" shape. The other ends (not shown) of the word lines $WL_1/WL_3$ are disposed in the array region R1 and extend to another winding region (not shown), and are respectively arranged in a horizontal "V" shape.

The memory device 100 further includes a plurality of selection gates SG, which are respectively arranged on two sides of the word lines WL. The selection gates SG are provided in the array region R1.

The selection gates SG includes a plurality of selection gates $SG_{00}$ (not shown) and $SG_{01}$ that are arranged on two sides of the word lines $WL_0$, a plurality of selection gates $SG_{10}$ and $SG_{11}$ arranged on two sides of the word lines $WL_1$, and a plurality of selection gates $SG_{20}$ and $SG_{21}$ arranged on two sides of the word lines $WL_2$, and a plurality of selection gates $SG_{30}$ and $SG_{31}$ (not shown) arranged on two sides of the word lines $WL_3$.

The memory device 100 further includes a plurality of landing pads LP arranged in the winding region R3 as the pickups of the word lines WL. The landing pad LP includes landing pads $LP_{01}$, $LP_{20}$, and $LP_{21}$ (shown on the left side of FIG. 1A). The landing pads $LP_{01}$, $LP_{20}$, and $LP_{21}$ respectively extend in the direction D2 and are arranged in the direction D1. In addition, the landing pads $LP_{01}$, $LP_{20}$, and $LP_{21}$ are aligned with each other in the direction D2. The landing pads $LP_{01}$ and $LP_{20}$ are separated from each other, and they are arranged at the end $E_{10}$ of the word lines $WL_1$ and are arranged along the direction D2. The landing pads $LP_{01}$ extends from the area A1 to the area A0, and are connected to the ends $E_{00}$ of part of the word lines WL0. The landing pads $LP_{20}$ extend from the area A1 to the area A2 and are connected to the ends $E_{20}$ of part of the word lines $WL_2$. The landing pads $LP_{21}$ are disposed at the ends $E_{30}$ of the word lines $WL_3$, and they extend from the area A3 to the area A2 and are connected to the ends $E_{20}$ of the other part of the word lines $WL_2$. The landing pads LP also include other landing pads, which are respectively disposed at the other ends of the word lines $WL_0$ and $WL_2$ relative to the ends $E_{00}$ and $E_{20}$ (on the right side of FIG. 1A, not shown), and are connected to the word lines $WL_1$ and $WL_3$.

In the embodiment of the present disclosure, the memory device 100 further includes a dummy structure DS disposed between the winding region R3 and the array region R1. The dummy structure DS is arranged beside the word lines WL arranged flush at the ends. In FIG. 1A, the dummy structure DS may include dummy structures $DS_1$ and $DS_3$. The dummy structure $DS_1$ is disposed in the area A1 and is beside the end $E_{10}$ of the word lines $WL_1$; the dummy structure $DS_3$ is disposed in the area A3 and is beside the end $E_{30}$ of the word lines $WL_3$. The dummy structure DS may also include other dummy structures, which are respectively disposed in the areas A0 and A2 and are disposed beside the other ends (not shown) of the word lines $WL_0$ and $WL_2$. The dummy structure DS may be floating and not connected to an external circuit.

The dummy structure DS has a comb shape, for example. The dummy structure DS includes a main part MP and a plurality of extension parts EP. The main part MP is disposed in the transition region R2, and the main part MP is adjacent to the landing pad LP at a non-zero distance. The shape and the arrangement direction of the main part MP are more similar to the shape and the arrangement direction of the landing pad LP than the extension parts EP. Both the main part MP and the landing pad LP are solid blocks. The extension direction of the main part MP is the same as the extension direction of the landing pad LP, as they both extend along the direction D2.

The extension parts EP are disposed in the array region R1. The shape and arrangement direction of the extension parts EP are more similar to the shape and arrangement direction of the word line WL than those of the main part MP. The extension direction of the extension parts EP is the same as the extension direction of the word line WL, as they both extend along the direction D1. The arrangement direction of the extension parts EP is also the same as the arrangement direction of the word line WL, as they are both arranged along the direction D2. The extension parts EP are connected to the main part MP and are adjacent to the word lines WL with a non-zero distance. The distance d1 between the extension part EP and the word lines WL is less than 114 nm, such as a distance between 30 nm to 114 nm. The selection gates $SG_{10}$ and $SG_{11}$ extend and protrude from the end of the word line $WL_1$, and the length L of the main part MP is less than the distance d3 between the selection gates $SG_{10}$ and $SG_{11}$ that are on two sides of the word line $WL_1$.

The width $W_2$ of the extension part EP is greater than twice the width $W_1$ of the word lines WL. For example, it is 2.5 to 3.5 times the width $W_1$ of the word lines WL. The width $W_3$ of the main part MP is greater than the width $W_2$ of the extension part EP. For example, it is 6 to 9 times the width $W_1$ of the word lines WL.

The dummy structure DS is formed by pattern transfer of a hard mask pattern (also called a dummy pattern). The configuration of the dummy structure DS improves the loading effect in the etching process of forming the word lines WL and the landing pads LP, so that the center and the end of the array region have similar contours. The manufacturing process of the memory device 100 mentioned above can be described with reference to the following embodiments, but it is not limited thereto.

An embodiment of the present disclosure provides a method of manufacturing a memory device, and the steps are as follows. First, please refer to FIG. 2A to FIG. 5A, in which a substrate 10 is provided. The substrate 10 may include an array region R1, a transition region R2, and a winding region R3. In this embodiment, the array region R1 may be a memory array region having one or more memory cells, and the winding region R3 may be a winding area having one or more word-line pickups. The transition region R2 is between the array region R1 and the winding region R3. In one embodiment, the substrate 10 may be, for example, a semiconductor substrate, a semiconductor compound substrate, or a silicon-on-insulator (SOI) substrate. In this embodiment, the substrate 10 is a silicon substrate.

Next, a target layer 12 is formed on the substrate 10. The target layer 12 may be a stacked layer 110 with layers stacked in a direction D3. Specifically, as shown in the enlarged view of FIG. 3A, the stacked layer 110 may include a tunneling dielectric layer 102, a patterned floating gate layer 104, an inter-gate dielectric layer 106, a control gate layer 108, a metal layer 112, and a cap layer 114 sequentially stacked from bottom to top.

Figure 3A:
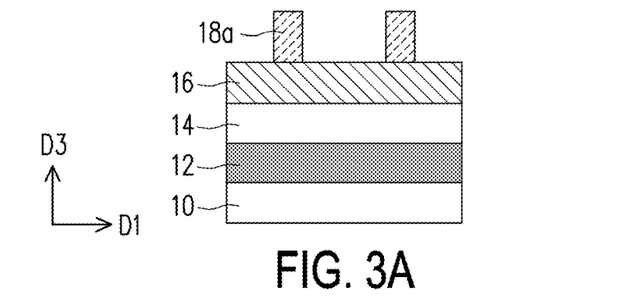
FIG. 3A to FIG. 3H are cross-sectional views taken along the line III-III in FIG. 2A to FIG. 2H.
Figure 3B:
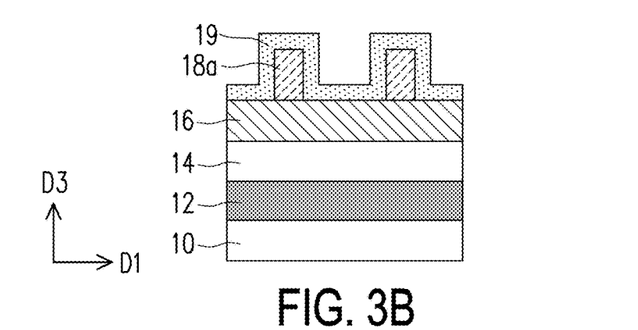
Figure 3C:
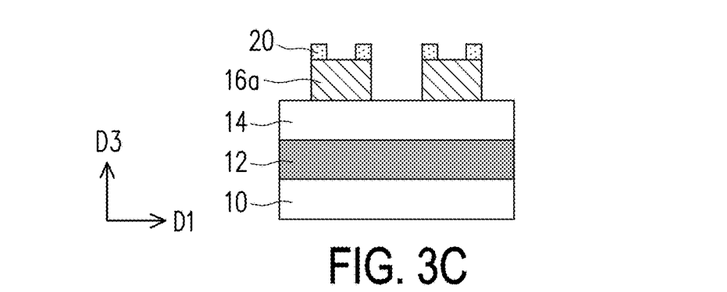
Figure 3D:
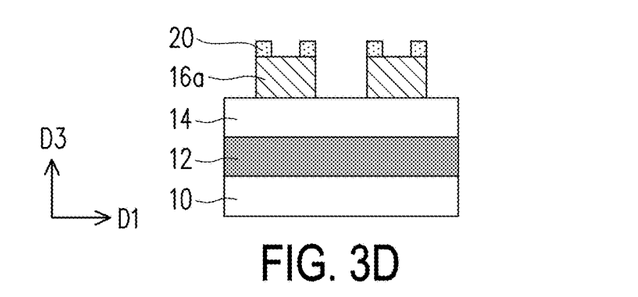
Figure 3E:
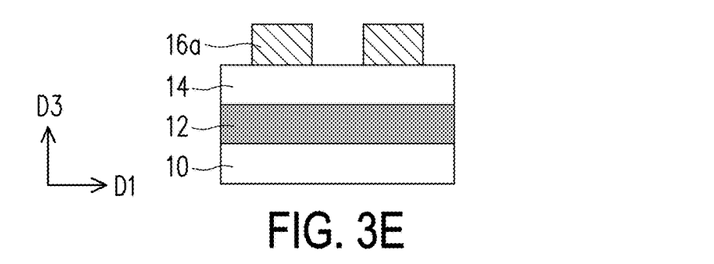
Figure 3F:
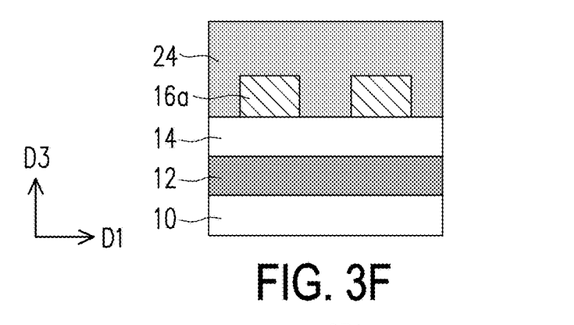
Figure 3G:
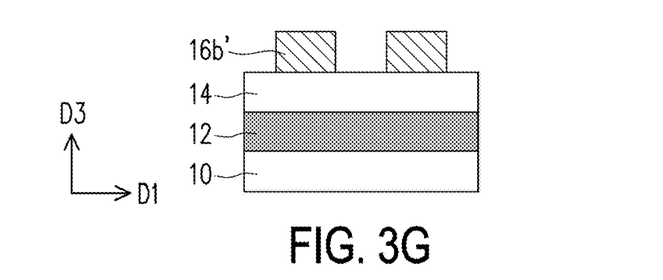
Figure 3H:
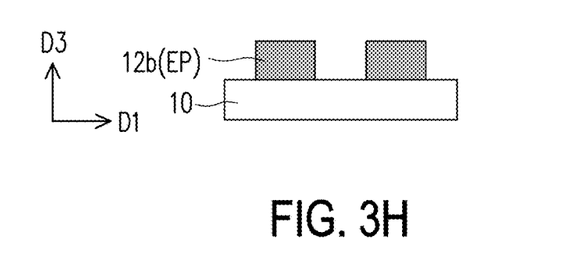

The material of the tunneling dielectric layer 102 may be silicon oxide, for example. The patterned floating gate layer 104 may extend along the direction D2, and its material may include a conductive material, such as doped polysilicon, undoped polysilicon, or a combination thereof. The inter-gate dielectric layer 106 can be, for example, a composite layer composed of nitride/oxide/nitride/oxide/nitride (NONON), but the present disclosure is not limited thereto. This composite layer may include three layers, five layers, or more. The material of the control gate layer 108 may include a conductive material, such as doped polysilicon, undoped polysilicon, or a combination thereof. The material of the metal layer 112 may be, for example, W, TiN, or a combination thereof. The material of the cap layer 114 may include a dielectric material, such as silicon nitride, silicon oxynitride, or a combination thereof.

Then, a sacrificial layer 14 and a hard mask layer 16 are formed on the stacked layer 110. The sacrificial layer 14 may also be referred to as a hard mask layer. The sacrificial layer 14 may be a silicon oxide layer. The hard mask layer 16 may contain a single layer or multiple layers. The hard mask layer 16 is, for example, a polysilicon layer. Afterwards, a core layer 18 is formed on the hard mask layer 16. The core layer 18 includes core patterns 18a, 18b, and 18c that are respectively located in the array region R1, the transition region R2, and the winding region R3. The core pattern 18a extends in the direction D1, and the core patterns 18b and 18c extend in the direction D2. The direction D1 and the direction D2 are perpendicular to each other. The core pattern 18b is connected to the core pattern 18a and is separated from the core pattern 18c.

In an embodiment, the core layer 18 may include a carbide layer. In another embodiment, the core layer 18 may include a carbide layer and an anti-reflection layer. The material of the carbide layer may be spin-on-carbon (SoC), for example. The material of the anti-reflective layer can be, for example, silicon oxynitride. The core layer 18 is formed by forming a carbide material layer and an anti-reflective material layer, and then forming a photoresist pattern on the anti-reflective material layer through a lithography process. In some embodiments, after the photoresist pattern is formed, a trimming process is further performed to reduce the width of the formed photoresist pattern. Thereafter, an etching process is performed to transfer the pattern of the photoresist pattern down to the anti-reflective material layer and the carbide material layer. Afterwards, the photoresist pattern is removed.

In FIG. 2B to FIG. 5B and FIG. 2C to FIG. 5C, a self-aligning double patterning (SADP) is performed to form a spacer wall 20 on the hard mask layer 16. The material of the spacer wall 20 includes oxide, such as silicon oxide. In an alternative embodiment, a self-aligning quadruple patterning (SAQP) can also be performed to form spacer walls 20 with a higher pattern density. The method of forming the spacer wall 20 is, for example, first forming a spacer material layer 19 on the hard mask layer 16 and on the top surface and side walls of the core layer 18, as shown in FIG. 2B to FIG. 5B. The spacer material layer 19 is then subjected to an anisotropic etching process to remove part of the spacer material layer 19 until the top surface of the hard mask layer 16 and the core layer 18 are exposed to form on the sidewalls of the core layer 18 a spacer wall 20. Afterwards, the spacer wall 20 and the core layer 18 are used as a mask to continue the etching and remove the hard mask layer 16 not covered by the spacer wall 20 and the core layer 18 to form hard mask patterns 16a, 16b, and 16c respectively in the array region R1, the transition region R2, and the winding region R3. In the process of etching the hard mask layer 16, the core layer 18 is also etched and removed, exposing part of the top surface of the hard mask patterns 16a, 16b, and 16c as shown in FIG. 2C to FIG. 5C. The hard mask pattern 16a extends in the direction D1, and the hard mask patterns 16b and 16c extend in the direction D2. The hard mask pattern 16b is connected to the hard mask pattern 16a and is separated from the hard mask pattern 16c.

In FIG. 2D to FIG. 5D and FIG. 2E to FIG. 5E, a cutting process of the spacer wall 20 is performed to form spacer walls 20a, 20b, and 20c that are separated from one another. The cutting process of the spacer wall 20 is described as follows.

First, in FIG. 2D to FIG. 5D, a mask layer 22 is formed on the sacrificial layer 14. The mask layer 22 is, for example, a patterned photoresist layer. The mask layer 22 includes mask patterns 22a, 22b, and 22c. The mask pattern 22a partially covers the array region R1. The mask pattern 22b covers part of the winding region R3 and the transition region R2. The mask pattern 22c covers another part of the winding region R3 and another part of the transition region R2. The mask patterns 22a, 22b, and 22c are separated from each other. The spacer wall 20, the hard mask patterns 16a and 16b, and the sacrificial layer 14 disposed at the end of the array region R1 and at one side of the transition region R2 (close to the array region R1) are exposed from the mask patterns 22a and 22b and from the mask patterns 22a and 22c. The spacer wall 20, the hard mask patterns 16c and 16b, and the sacrificial layer 14 in the winding region R3 and on the other side (away from the array region R1) of the transition region R2 are exposed from the mask patterns 22b and 22c.

In FIG. 2E to FIG. 5E, an etching process, such as an anisotropic etching process, is performed to remove the spacer walls 20 not covered by the mask patterns 22a, 22b, and 22c to form the spacer walls 20a, 20b, and 20c. Afterwards, the mask patterns 22a, 22b, and 22c are removed. The spacer walls 20a are separated from each other in the array region R1, and their respective lengths in the direction D1 are shorter than the length of the sacrificial layer 14 that is not covered by the hard mask pattern 16a in the array region R1. The spacer walls 20b are disposed in the transition region R2, extending in the direction D2, and arranged separately from each other in the direction D2. The spacer walls 20c are disposed in the winding region R3, extending in the direction D2, and arranged separately from each other in the direction D2.

In FIG. 2F to FIG. 5H, a patterning process of the target layer 12 is performed to form target patterns 12a, 12b, and 12c. The patterning process of the target layer 12 is described as follows. In the target layer 12, a hard mask layer 16' shown in FIG. 2G is adopted as an etching mask, and the forming method of the hard mask layer 16' can be described as follows with reference to FIG. 2F to FIG. 5G.

In FIG. 2F to FIG. 5G, a mask layer 24 is formed on the substrate 10. The mask layer 24 is, for example, a patterned photoresist layer. The mask layer 24 has openings OP1 and OP2. The opening OP1 exposes the spacer wall 20a, the hard mask pattern 16a, and the sacrificial layer 14 in the array region R1. The opening OP2 extends in the directions D1 and D2. The shape of the opening OP2 is, for example, a double-row comb shape composed of a plurality of crosses. The opening OP2 exposes the hard mask pattern 16c and the sacrificial layer 14 in the winding region R3 in the direction D1. The opening OP2 exposes the hard mask pattern 16c in the winding region R3 in the direction D2.

In FIG. 2G to FIG. 5G, the mask layer 24 and the spacer wall 20a are adopted as masks to pattern the hard mask patterns 16a, 16b, and 16c into the hard mask layer 16'. The hard mask layer 16' includes hard mask patterns 16a', 16b', and 16c'. The hard mask pattern 16a' covers the array region R1. The hard mask pattern 16b' covers the transition region R2 and extends to the array region R1. The hard mask pattern 16c' covers the winding region R3.

Figure 2A:
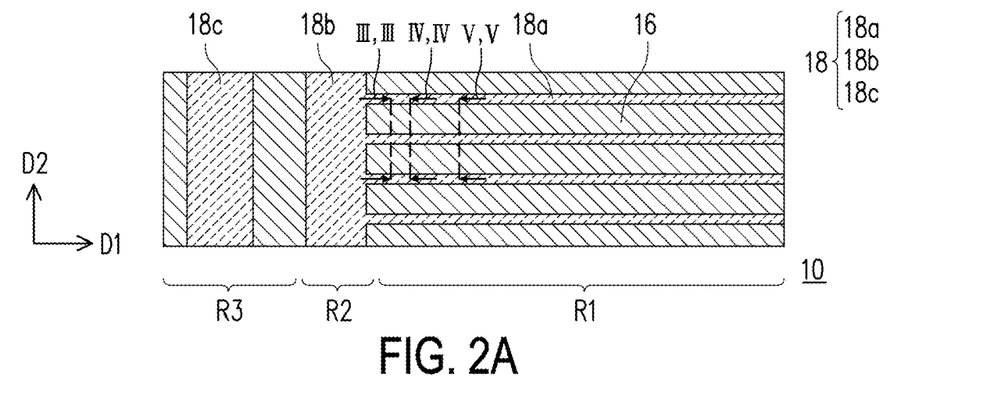
FIG. 2A to FIG. 2H are top views showing a method of manufacturing a memory device according to an embodiment of the present disclosure.
Figure 2B:
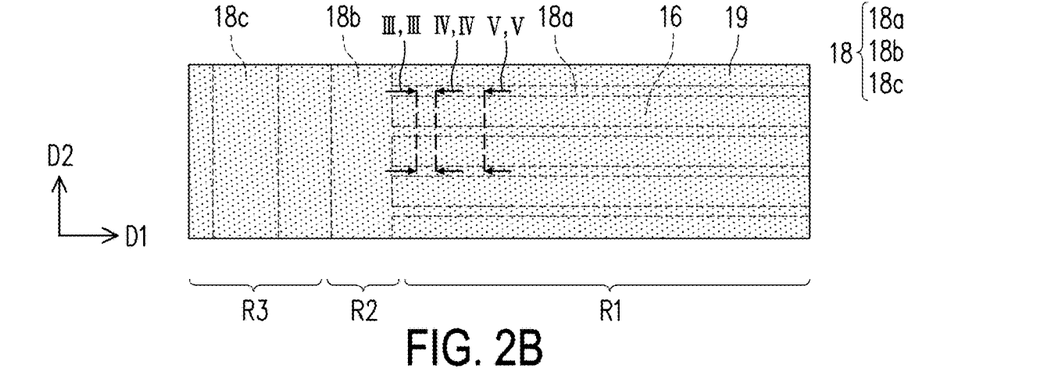
Figure 2C:
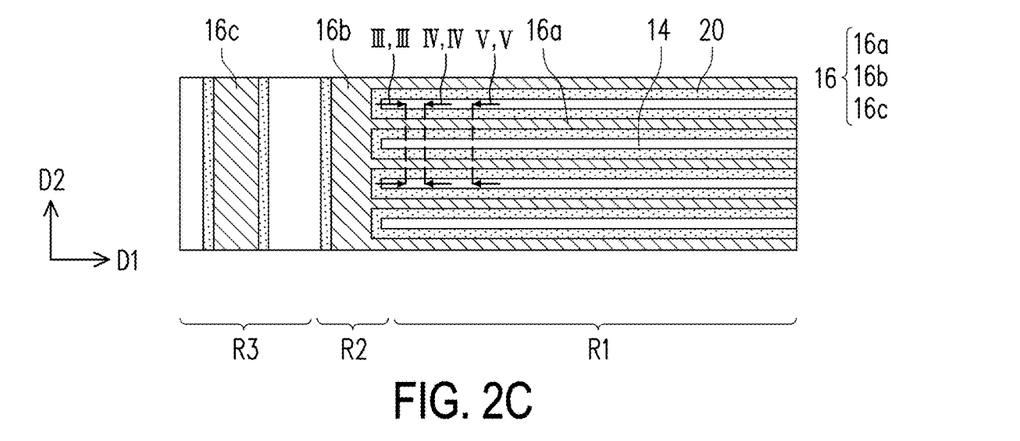
Figure 2D:
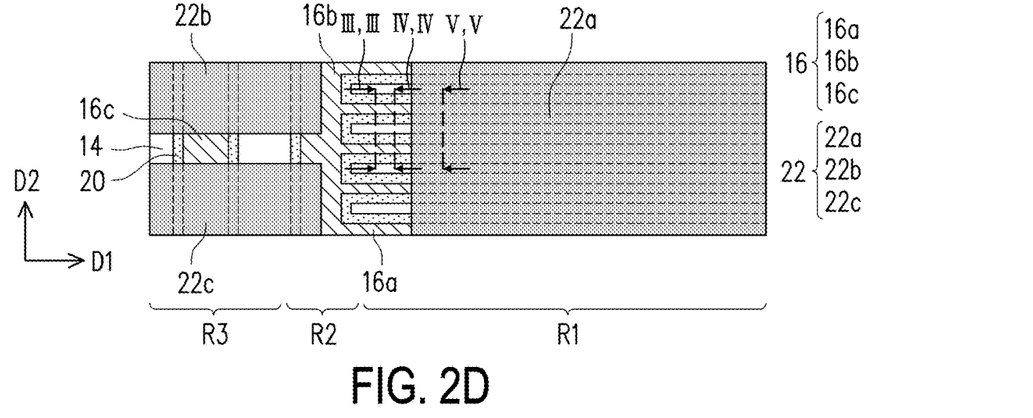
Figure 2E:
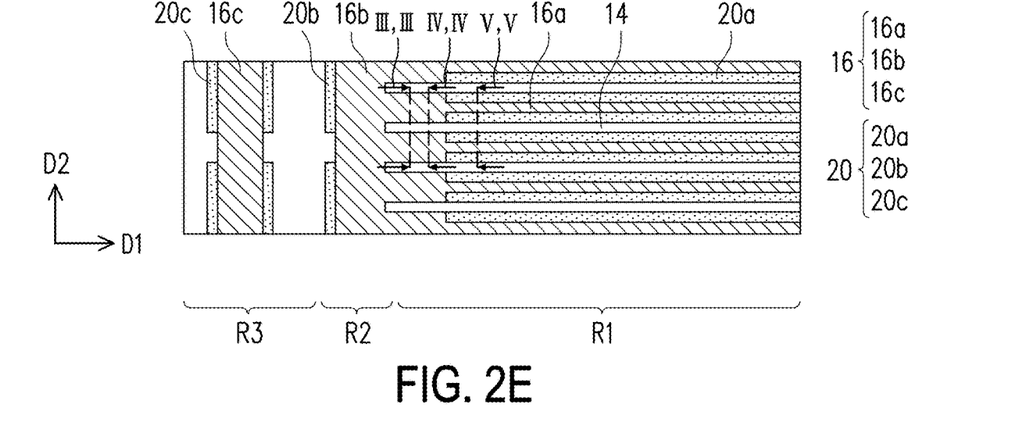
Figure 2F:
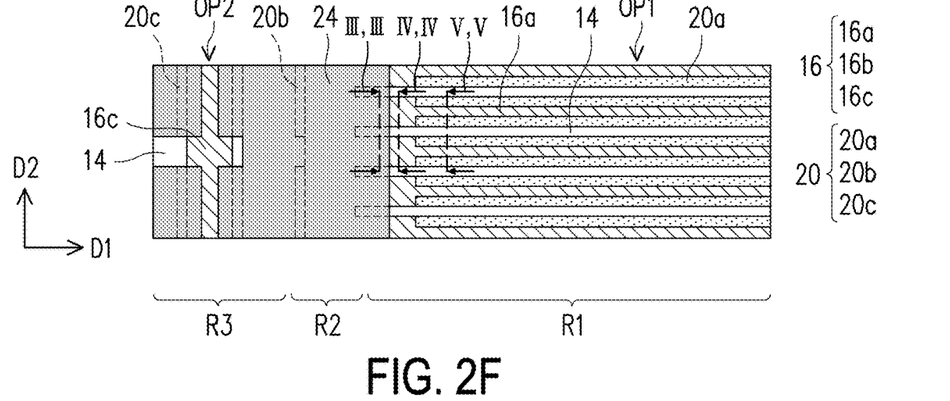
Figure 2G:
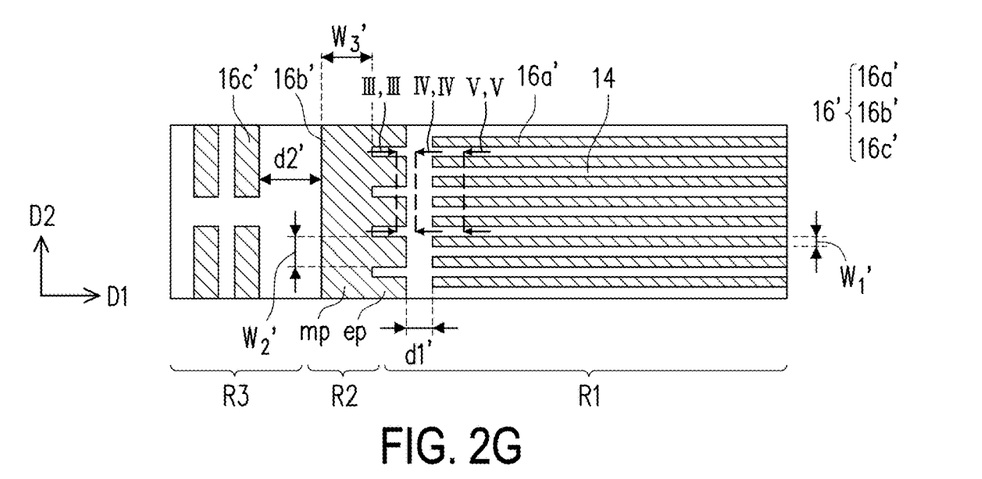

The hard mask pattern 16b' can also be referred to as a dummy pattern. The hard mask pattern 16b' is, for example, in a comb shape. The hard mask pattern 16b' includes a main part mp and a plurality of extension parts ep. The main part mp is a solid block which extends along the direction D2, and it is disposed in the transition region R2 and is adjacent to the hard mask pattern 16c' at a non-zero distance d2'. The extension parts ep extend along the direction D1, and they are arranged along the direction D2 and are disposed in the array region R1. The extension parts ep are connected to the main part mp and are adjacent to the hard mask pattern 16a' by a non-zero distance d1'. The width $W_3'$ of the main part mp is greater than the width $W_2'$ of each extension part EP, and the width $W_2'$ of each extension part EP is greater than the width $W_1'$ of each hard mask pattern 16a'. The distance d1' between the hard mask pattern 16b' and the hard mask pattern 16a' is controlled based on the capability of the process, so as to reduce the loading effect of the subsequent etching process. For example, the distance d1' is controlled within 114 nm, such as a distance between 30 nm and 114 nm.

In FIG. 2H to FIG. 5H, a hard mask layer 16' is adapted as a mask to perform an etching process. The etching process may be an anisotropic etching process, such as a reactive ion etching (RIE) process, for patterning the sacrificial layer 14 and the target layer 12 to form a patterned oxide layer and target patterns 12a, 12b, and 12c. Afterwards, the mask layer 24 and the spacer wall 20a are removed. Since the distance d1' between the hard mask pattern 16b' and the hard mask pattern 16a' is controlled within an appropriate range and they are a solid block, the loading effect between the central area and the end area of R1 of the array region may be reduced during the etching process, so that the target pattern 12a between the central area and the end area has a similar contour.

Figure 2H:
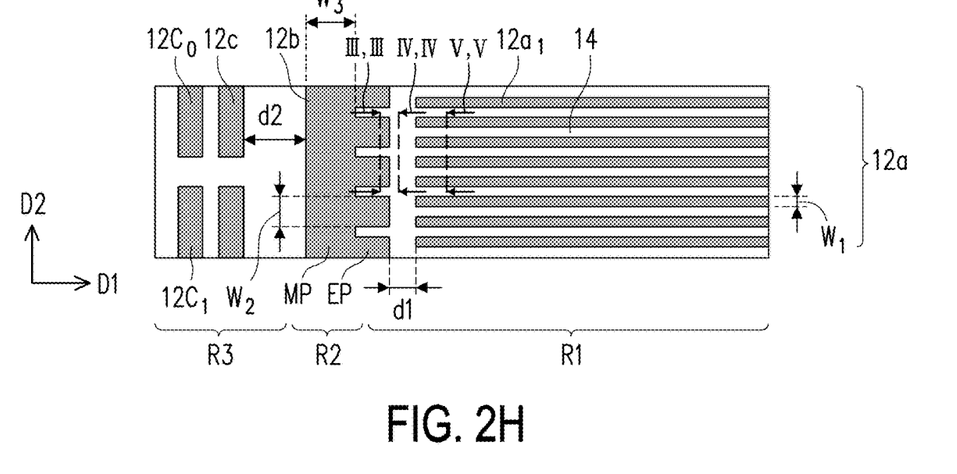

The target pattern 12a may include a plurality of target patterns $12a_1$. The target patterns $12a_1$ are disposed in the array region R1, and they are extending along the direction D1 and are arranged along the direction D2.

A plurality of target patterns 12c are disposed in the winding region R3. The target patterns 12c include a plurality of target patterns $12c_0$ and $12c_1$, which respectively extend along the direction D2. The target patterns $12c_0$ and $12c_1$ all extend along the direction D2, and they are arranged along the direction D1. The target pattern $12c_0$ and the target pattern $12c_1$ are separated from each other and are arranged in rows along the direction D2. The width of the target pattern 12c is, for example, 4 to 6 times the width $W_1$ of the target pattern $12a_1$.

The target pattern 12b is disposed between the target patterns $12a_1$ and the target patterns 12c. The target pattern 12b is also called a dummy structure, and it may be, for example, comb-shaped. The target pattern 12b includes a main part MP and a plurality of extension parts EP. The main part MP is a solid block that extends along the direction D2, and it is disposed in the transition region R2 and is adjacent to the target pattern 12c at a non-zero distance. The extension parts EP extend along the direction D1, and they are arranged along the direction D2 and are disposed in the array region R1. The extension parts EP are connected to the main part MP, and they are adjacent to the target patterns $12a_1$ at a non-zero distance d1 and are adjacent to the target patterns 12c at a non-zero distance d2. The distance d1 between the extension part EP and the target pattern $12a_1$ is less than 114 nm, such as a distance between 30 nm and 114 nm.

The width $W_2$ of the extension part EP is greater than 2 times the width $W_1$ of the target pattern. For example, it is 2.5 to 3.5 times the width $W_1$ of the target pattern. The width $W_3$ of the main part MP is larger than the width $W_2$ of the extension part EP. For example, it is 4 to 9 times the width $W_1$ of the target pattern $12a_1$.

In FIG. 1B, the target pattern 12a may also include a plurality of target patterns $12a_{10}$ and $12a_{11}$. The target patterns $12a_{10}$ and $12a_{11}$ are disposed on two sides of the target pattern $12a_1$. The target patterns $12a_{10}$ and $12a_{11}$ are disposed in the array region R1, and they extend along the direction D1 and are arranged along the direction D2. The widths of the target patterns $12a_{10}$ and $12a_{11}$ are, for example, 4 to 6 times the width $W_1$ of the target pattern $12a_1$.

Figure 4A:
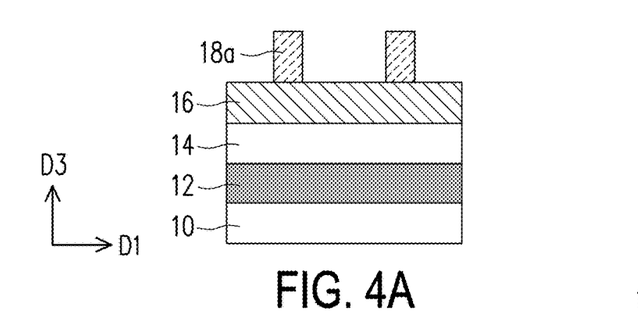
FIG. 4A to FIG. 4H are cross-sectional views taken along the line IV-IV in FIG. 2A to FIG. 2H.
Figure 4B:
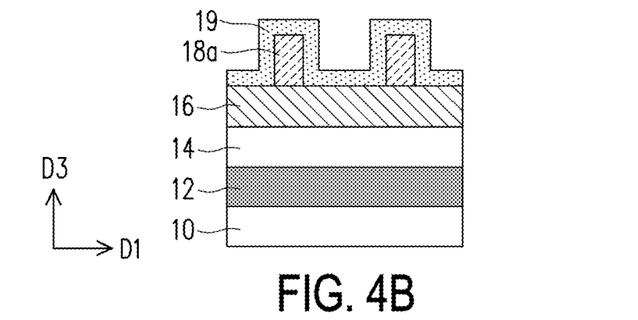
Figure 4C:
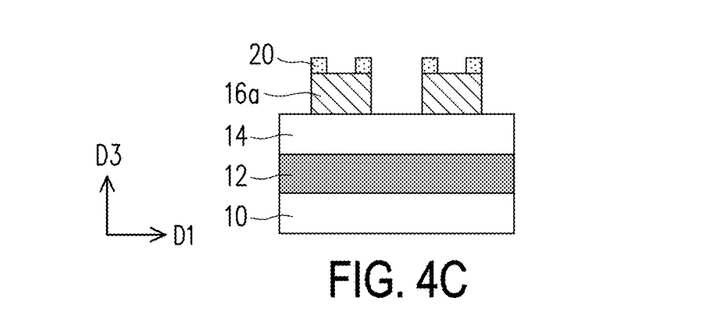
Figure 4D:
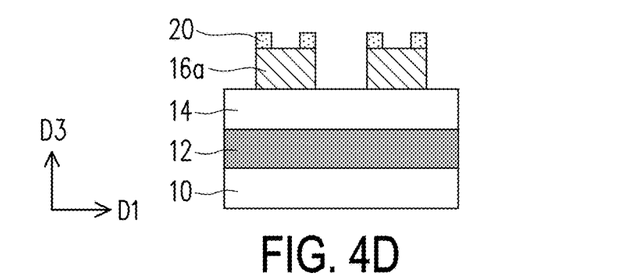
Figure 4E:
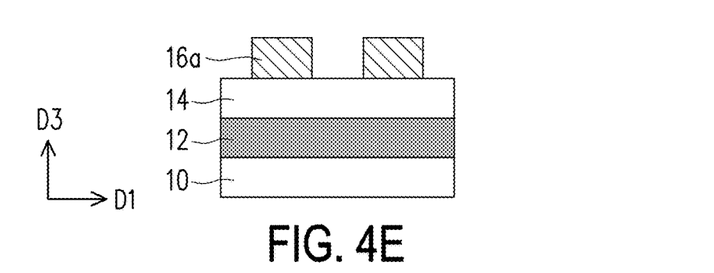
Figure 4F:
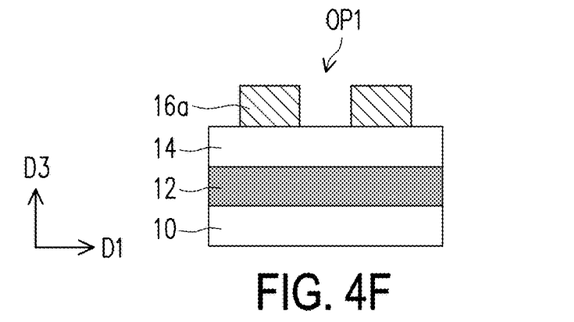
Figure 4G:
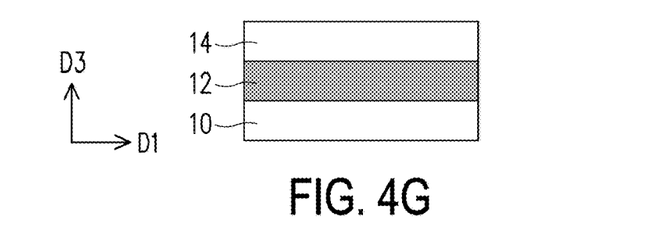
Figures 4H, 5H:
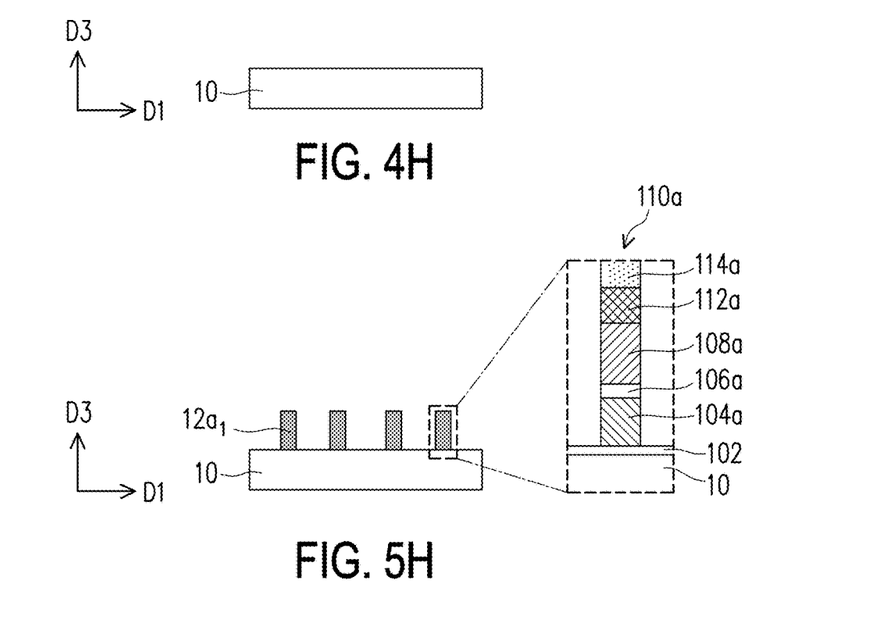
FIG. 5A to FIG. 5H are cross-sectional views taken along the line VV in FIG. 2A to FIG. 2H.
Figure 5A:
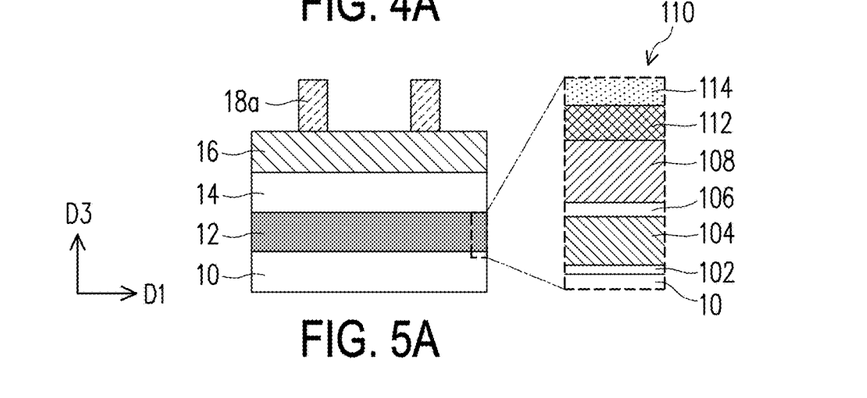
Figure 5B:
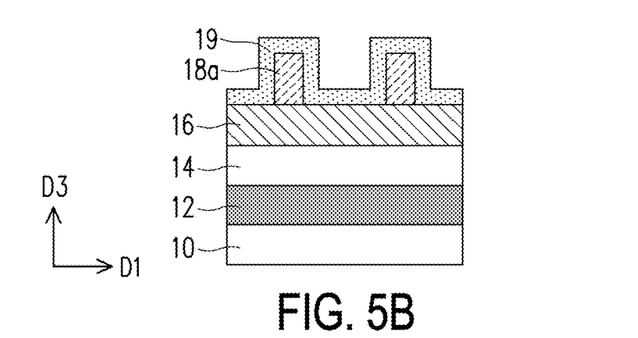
Figure 5C:
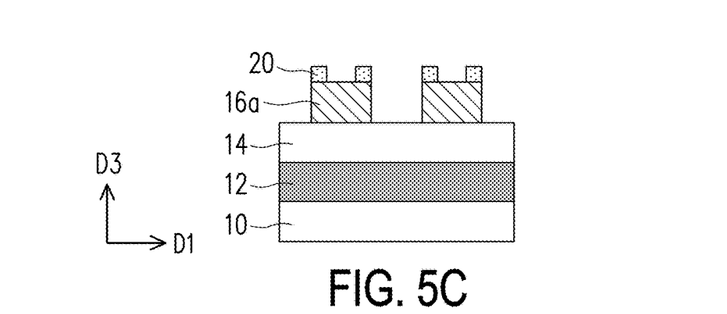
Figure 5D:
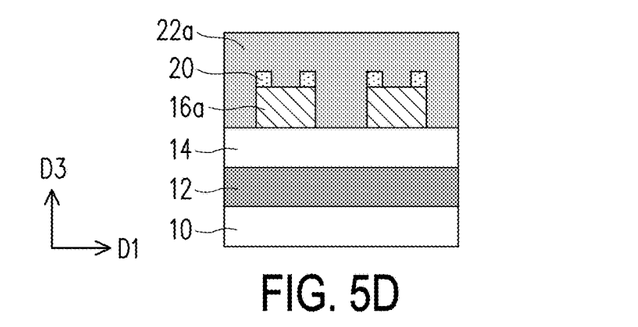
Figure 5E:
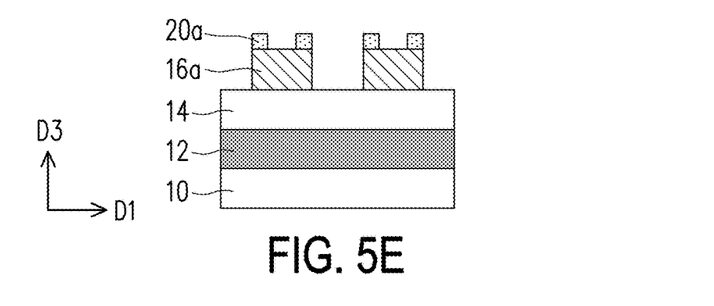
Figure 5F:
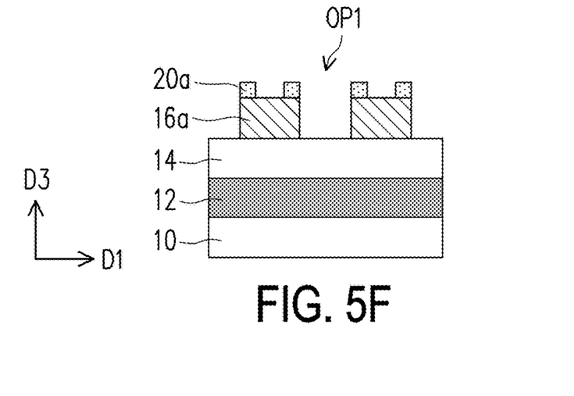
Figure 5G:
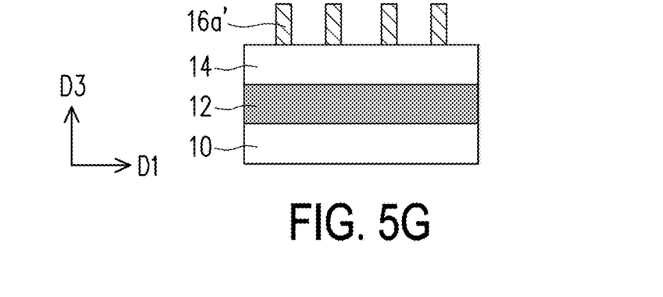

As shown in FIG. 1A and FIG. 1B, in some embodiments, the target pattern $12a_1$ is a patterned stacked layer 110a including a word line $WL_1$ (as shown in the partial enlarged view of FIG. 5H). The patterned stack layer 110a includes a tunneling dielectric layer 102, a patterned floating gate layer 104a, an inter-gate dielectric layer 106a, a control gate layer 108, a metal layer 112a, and a cap layer 114a. In other embodiments, the tunneling dielectric layer 102 may also be patterned. The aspect ratio of the patterned stacked layer 110a is, for example, a range of 10 to 12. The target patterns $12a_{10}$ and $12a_{11}$ are patterned stacked layers that respectively include a selection line $SG_{10}$ and a selection line $SG_{11}$. The target patterns $12c_0$ and $12c_1$ are patterned stacked layers that respectively include the landing pad $LP_{01}$ acting as the word line $WL_0$ and the landing pad $LP_{20}$ acting as the word line $WL_2$. The target pattern 12b is a patterned stacked layer that includes the dummy structure $DS_1$.

Although the above embodiments use a flash memory as an example to illustrate a series of patterning steps, the disclosure is not limited thereto. In other embodiments, this patterning step can also be used to form a dynamic random access memory (DRAM) or similar target layer/film.

In summary, the embodiments of the present disclosure improves the loading effect during the etching process of forming word lines and landing pads by providing a hard mask pattern (also called a dummy pattern) for forming the dummy structure DS, which allows the center and the end of the array region to have similar contours to avoid bridging or defects. And under this situation, the target layer in the array region and the winding area can be patterned at the same time, thereby forming multiple stacked structures with different pattern densities in the array region and the winding area.

What is claimed is:

1. A memory device, comprising:
    a substrate;
    a plurality of word lines, extending in a first direction, arranged in a second direction, and disposed on the substrate;
    a dummy structure, adjacent to ends of the word lines, and disposed on the substrate, wherein the dummy structure comprises:
    a main part, extending in the second direction;
    a plurality of extension parts, extending in the first direction, connected to the main part, and interposed between the main part and the word lines; and
    a plurality of landing pads extending in the second direction and respectively connected to a plurality of other word lines, wherein the dummy structure is disposed between the landing pads and the word lines.

2. The memory device according to claim 1, wherein the dummy structure has a comb shape.

3. The memory device according to claim 1, wherein a width of the main part of the dummy structure is greater than a width of each of the extension parts, and the width of each of the extension parts is greater than a width of each of the word lines.

4. The memory device according to claim 1, wherein the main part of the dummy structure is a solid block.

5. The memory device according to claim 1, further comprising two selection gates respectively disposed on two sides of the word lines, wherein a length of the main part is shorter than a distance between the two selection gates.

6. A method of manufacturing a memory device, comprising:
    providing a substrate;
    forming a target layer and a hard mask layer on the substrate;
    patterning the hard mask layer to form a patterned hard mask layer, the patterned hard mask layer comprising:
    a plurality of first patterns, a second pattern, and a plurality of third patterns, wherein the first patterns extend in a first direction and are arranged in a second direction, the second pattern is comb-shaped and disposed between the first patterns and the third patterns, and the third patterns extend in the second direction and are arranged in the first direction; and transferring the first patterns, the second pattern, and the third patterns to the target layer by using the patterned hard mask layer, so as to form a plurality of word lines, a comb-shaped dummy structure, and a plurality of landing pads.

7. The method of manufacturing the memory device according to claim 6, wherein the second pattern comprises a main part and a plurality of extension parts, the main part extends in the second direction, and the extension parts extend in the first direction and are arranged in the second direction.

8. The method of manufacturing the memory device according to claim 7, wherein a width of the main part is greater than a width of each of the extension parts, and the width of each of the extension parts is greater than a width of each of the first patterns.

9. The method of manufacturing the memory device according to claim 7, wherein the main part is a solid block.

\* \* \* \* \*